(12) United States Patent
Sato et al.

(10) Patent No.: US 6,744,679 B2
(45) Date of Patent: Jun. 1, 2004

(54) SEMICONDUCTOR MEMORY DEVICE

(75) Inventors: Hirotoshi Sato, Tokyo (JP); Masaki Tsukude, Tokyo (JP); Takafumi Takatsuka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/244,026

(22) Filed: Sep. 16, 2002

(65) Prior Publication Data

US 2003/0185060 A1 Oct. 2, 2003

(30) Foreign Application Priority Data

Mar. 28, 2002 (JP) .................................... P2002-091520

(51) Int. Cl.[7] ................................................ G11C 7/00
(52) U.S. Cl. ................ 365/194; 365/233.5; 365/230.06
(58) Field of Search ............................. 365/194, 233.5, 365/230.06, 233

(56) References Cited

U.S. PATENT DOCUMENTS

| | | | | |
|---|---|---|---|---|
| 5,625,595 A | * | 4/1997 | Ikeda | 365/194 |
| 6,122,220 A | * | 9/2000 | Kim et al. | 365/233.5 |
| 6,590,823 B2 | * | 7/2003 | Tsukude | 365/194 |
| 2001/0010650 A1 | * | 8/2001 | Lee | 365/198 |
| 2002/0178323 A1 | * | 11/2002 | Tsukude et al. | 711/106 |

OTHER PUBLICATIONS

U.S. patent application Ser. No. 09/988,172, Tsukude, filed Nov. 19, 2001.
U.S. patent application Ser. No. 09/987,895, Tsukude et al., filed Nov. 16, 2001.

* cited by examiner

*Primary Examiner*—Huan Hoang
(74) *Attorney, Agent, or Firm*—McDermott, Will & Emery (57) ABSTRACT

A DRAM performs data writing if a column activation signal ZCOLRE is activated with changing of an internal address Add and then an internal write control signal WDRV is activated by generation of a write signal WE from an outside. However, in order to solve a problem that data writing does not performed in some cases when the data writing is performed at optional timing, a semiconductor memory device according to the present invention includes a delay unit, thereby delaying an output of the internal write control signal WDRV until the column activation signal ZCOLRE is activated, even when the write signal WE is generated.

4 Claims, 6 Drawing Sheets

SEMICONDUCTOR MEMORY DEVICE

BACKGROUND OF THE INVENTION

1. Field of the Invention

The present invention relates to internal timing of a data write to a semiconductor memory device.

2. Description of the Related Art

In Dynamic Random Access Memory (DRAM) writing to a memory cell at an arbitrary timing as in SRAM may cause a data write error to occur.

Figure 7:
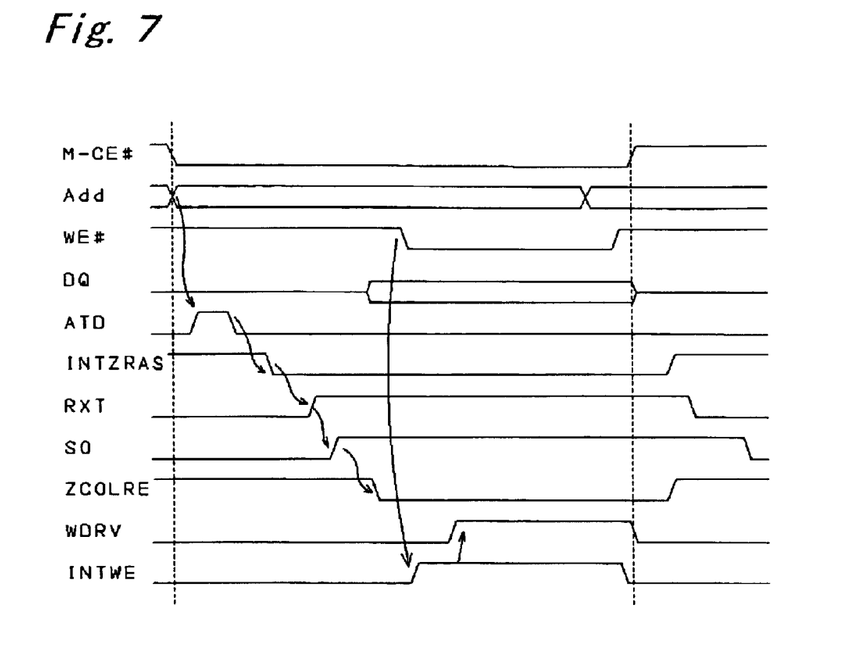
FIG. 7 is a timing diagram showing an operation of a conventional semiconductor memory device.

In this type of memory device, as shown in FIG. 7, when a chip enable signal M-CE# is at an "L" level, when a change occurs in address signal Add, which is an external address, the memory device is actuated relative to the change. Thus, an external write signal WE# (# is indicative of being an L level and active) is activated in the latter half of a cycle of address signal Add. Relative to the change of address signal Add, address transition detection signal ATD is generated, and thereafter, in accordance with a fall of address transition detection signal ATD, row activation signal INTZPAS, word activation signal RXT, sense amplifier activation signal SO and column activation signal ZCOLRE are activated in succession.

As shown in FIG. 7, when external write signal WE# is generated in the latter half of a cycle of address signal Add, in accordance with generation of external write signal WE#, internal write signal INTWE is activated. After a predetermined time elapses from the activation, internal write control signal WDRV is activated. At the point of time when the WDRV signal is activated, column activation signal ZCOLRE is already activated. Therefore, write of data DQ is carried out according to the internal write control signal WDRV, and no related data write error occurs.

Figure 8:
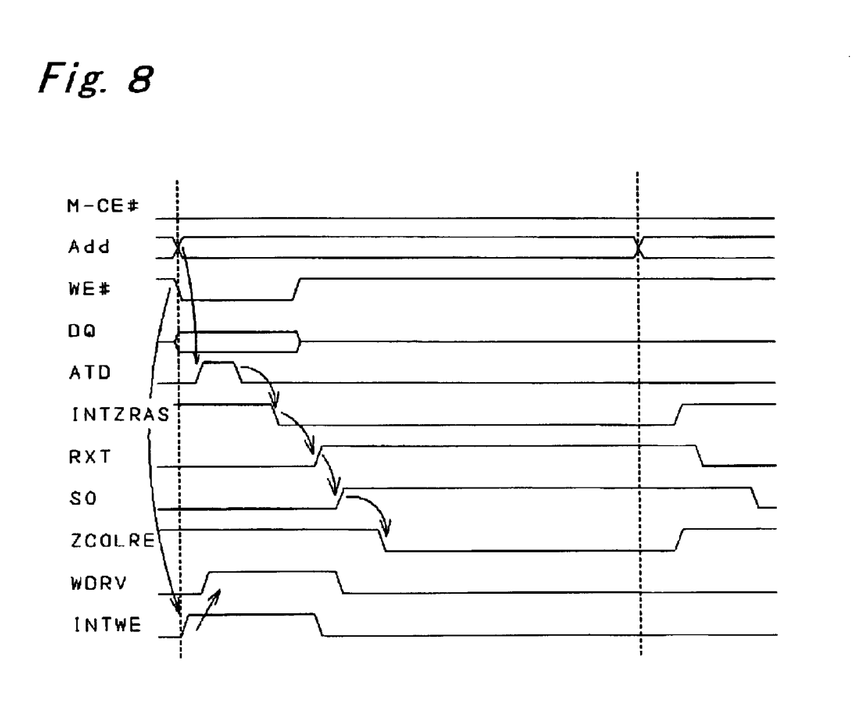
FIG. 8 is a timing diagram showing an operation of a conventional semiconductor memory device.

FIG. 8 illustrates a timing diagram when the external write signal WE# is activated in the first half of a cycle of address signal Add. In this case, as in the case represented by FIG. 7, relative to the change of the address signal Add, address transition detection signal ATD, row activation signal INTZPAS, word activation signal RXT, sense amplifier activation signal SO and column activation signal ZCOLRE are activated in succession.

In accordance with the generation of the external write signal WE#, internal write signal INTWE is activated. After a predetermined time elapses from this activation, internal write control signal WDRV is activated. However, because at the point of time when the WDRV signal is activated, the column activation signal ZCOLRE is not activated, the write of data DQ is not carried out according to the internal write control signal WDRV, and a related data write error occurs.

Figure 9:
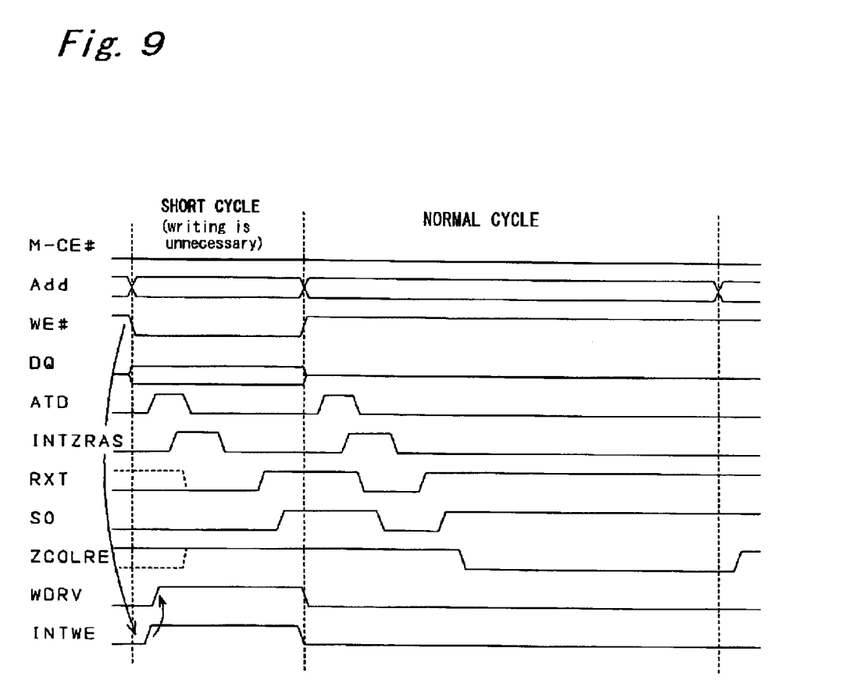
FIG. 9 is a timing diagram showing an operation of a conventional semiconductor memory device.

FIG. 9 illustrates a DRAM operating in a short cycle, shorter than a normal cycle. The short cycle is not conformable to the standard design. Therefore, no write is carried out. As shown, the external write signal WE# is generated for the period of the short cycle, and thereafter, a normal read cycle is carried out.

In the short cycle, internal write control signal WDRV is activated in accordance with the generation of the external write signal WE#. For this reason, when column activation signal ZCOLRE is activated (as shown by a dotted line) in the short cycle. Unnecessary, write is carried out and an error write is generated.

Usually, a design is made so that the write failure and error write are not generated. The inventor found that in the case when an internal write is carried out based on external write timing, a write failure and error write may occur depending on write timing.

An object of the present invention is to provide a memory device, which can carry out a normal write in a normal cycle without generating error write in various write timings.

SUMMARY OF THE INVENTION

In DRAM, data write is carried out when a column activation signal ZCOLRE is activated with a change of an internal address Add and an internal write control signal WDRV is activated by a generation of an external write signal WE. However, when the data write is carried out at an arbitrary timing, no data write is carried out in some cases.

In order to solve the above problem, according to an aspect of the disclosed concepts, a semiconductor memory device includes a delay circuit for delaying an output of the internal write control signal WDRV until the column activation signal ZCOLRE is activated even if the write signal WE is generated.

Moreover, in the case where the external write signal WE# is generated under a short cycle, when the column activation signal ZCOLRE is activated in the prior cycle, a problem arises such that error write is generated.

In order to solve the above problem, according to another aspect of the disclosed concepts, a semiconductor memory device includes a non-activation circuit for prohibiting activation of the internal write control signal WDRV by a change of the address signal of the next cycle when the external write signal WE# is inputted under a short cycle in which the external address signal is inputted in a short period shorter than a predetermined period.

DETAILED DESCRIPTION

First Embodiment

Figure 1:
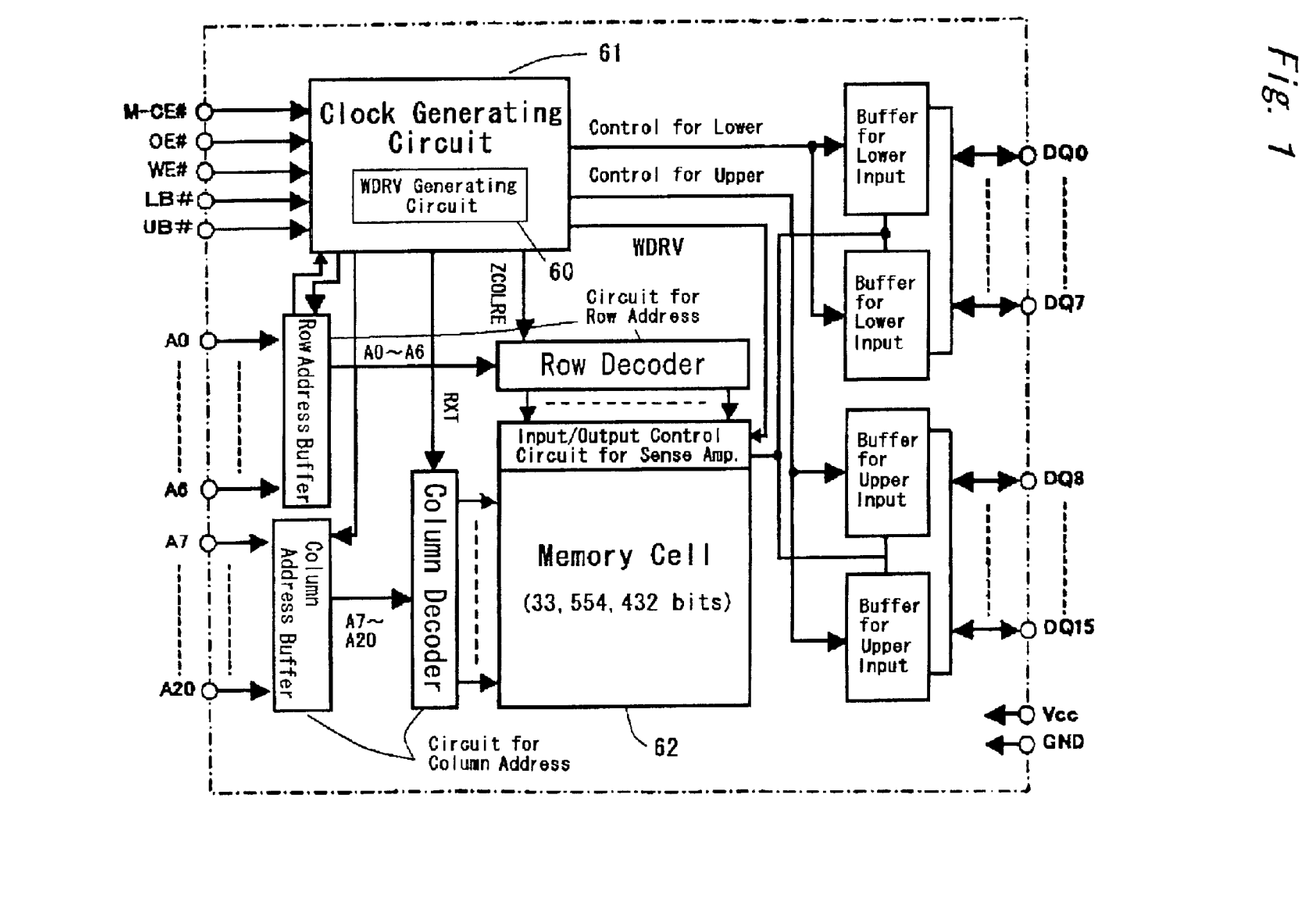
FIG. 1 is a block diagram showing a semiconductor memory device according to a first embodiment.

FIG. 1 is a block diagram showing a semiconductor memory device according to a first embodiment of the disclosed concepts. A clock generating circuit 61 generates an internal clock in accordance with a chip enable signal M-CE#, which is an external control signal, an output enable signal OE#, an external write signal WE#, a low-order byte data control signal LB#, and an upper-order byte data control signal UB#. Memory cell 62 may be a DRAM type, and has an input/output interface being compatible with an asynchronous SRAM, and further, controls the read, write, and refresh operations of the clock generating circuit 61. Further, memory cell 62 may be a fully hidden refresh type (i.e., refresh operation is not seen from the outside). Thus, the external clock typically does not control the refresh operation.

A read may be performed when an M-CE# terminal is in an "L" level, at least one of the LB# terminal and UB# terminal is in an "L" level, a WE# terminal is set to an "H" level and an OE# terminal is set to an "L" level. Thereafter, when an address is designated by external address signals A0 to A20 inputted to a row address buffer and a column address buffer shown in FIG. 1, a designated address data is outputted to a data input/output pin DQ (DQ0 to DQ15) terminal.

In the case where the read operation is carried out in a state with the LB# terminal is set to "L" and the UB# terminal is set to "H", the read data is outputted to the input/output pins DQ0 to DQ7, and input/output pins DQ8 to DQ15 have a high impedance. On the other hand, in the case where the read operation is carried out in a state that the LB# terminal is set to "H" and the UB# terminal is set to "L", the read data is outputted to the input/output pins DQ8 to DQ15, and the input/output pins DQ0 to DQ7 have a high impedance.

Furthermore, in the case where a read is carried out in a state that both of the LB# terminal and the UB# terminal set to "L", read data is outputted to the input/output pins DQ0 to DQ15. In the read cycle, the address is always captured in the present device when the signal M-CE# is an "L" level, and then, the read data is outputted.

When carried out a write may be performed when the M-CE# terminal is in an "L" level state, at least one of the LB# terminal and the UB# terminal is in an "L" level state, and the WE# terminal is set to an "L" level. Thereafter, when an address is designated, the data inputted from the DQ terminal is written into the designated address of the memory cell 62. In the case where the write is carried out in a state that the LB# terminal is set to "L" and the UB# terminal is set to "H", the data inputted from the DQ0 to DQ7 is written. However, the data from the DQ8 to DQ15 is neglected.

Further, in the case where the write is carried out in a state that the LB# terminal is set to "H" and the UB# terminal is set to "L", the data inputted from the DQ8 to DQ15 is written. However, the data from the DQ0 to DQ7 is neglected. In addition, in the case where the write is carried out in a state that both of the LB# terminal and the UB# terminal are set to "L", the data inputted from the DQ0 to DQ15 is written.

Furthermore, in the case where both of the WE# terminal and the OE# terminal are set to an "L" level, the write operation may be overridden. The address in writing is controlled so as not to have a change for the period when the signal WE# is an "L" level. The signal WE# rises up, and thereafter, the address can be changed.

Figure 2:
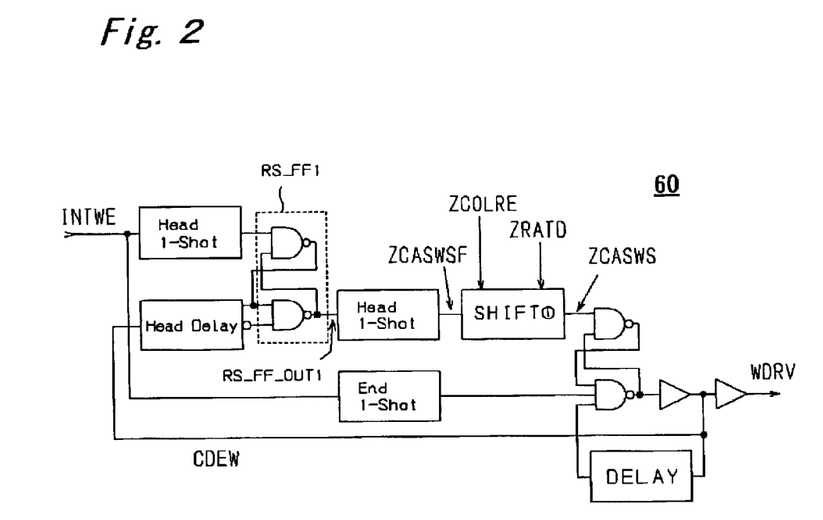
FIG. 2 is a circuit diagram showing a detailed configuration of a WDRV generating circuit shown in FIG. 1.

FIG. 2 shows an internal write control signal WDRV generating circuit 60 included in the clock generating circuit 61 of FIG. 1. The WDRV generating circuit 60 carries out a control using signals generated by other control circuits. In other words, the WDRV generating circuit 60 delays an internal write signal INTWE so as to generate an internal write control signal WDRV.

The signals generated by the other control circuits include an internal write signal INTWE, a column control signal ZCOLRE and an address transition detection signal ZRATD.

More specifically, the internal write signal INTWE is generated based on the external write signal WE#. The column control signal ZCOLRE is generated based on the address Add inputted to an external address pin Ai (i=0 to 20), and activates a column circuit when the chip enable signal M-CE# is applied. The address transition detection signal ZRATD is generated in accordance with a change of the address Add. Thus, the WDRV generating circuit 60 generates the internal write control signal WDRV.

Figure 3:
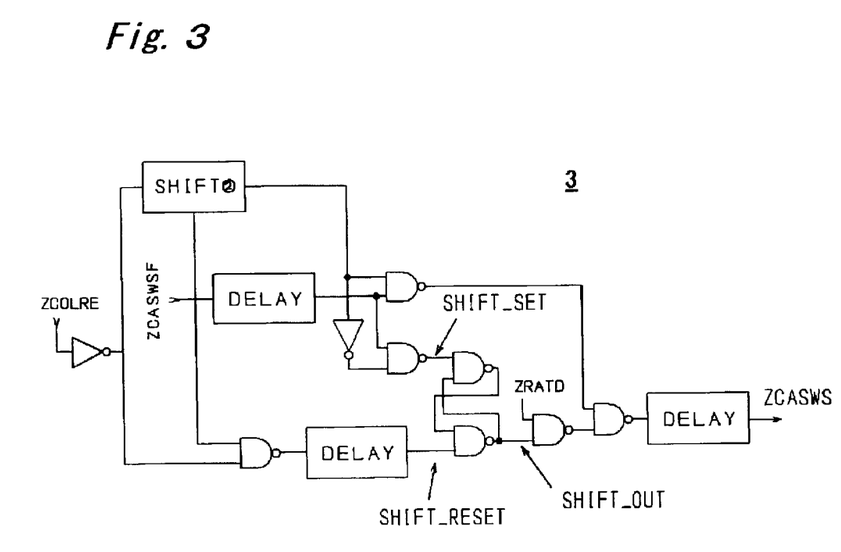
FIG. 3 is a circuit diagram showing a detailed configuration of a shift circuit shown in FIG. 2.

FIG. 3 shows a circuit configuration of a shift circuit 3 of FIG. 2. The shift circuit 3 carries out a control using signal generated by other control circuits. Those signals include a column control signal ZCOLRE, an address transition detection signal ZRATD, and a write early set signal ZCASWSF, which has a specific delay and is generated based on the internal write signal INTWE. The shift circuit 3 generates a write set signal ZCASWS, which is a trigger signal of the internal write control signal WDRV.

Figure 4:
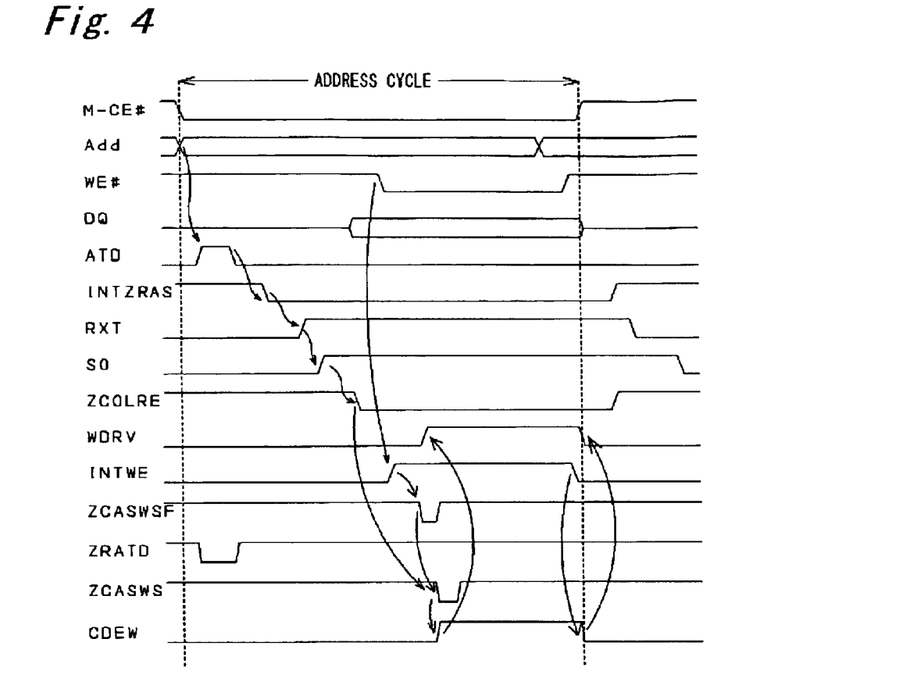
FIG. 4 is a timing diagram showing an operation of the semiconductor memory device.

FIG. 4 is a timing diagram showing a normal write timing when write signal WE# is activated in the latter half of the address cycle. The semiconductor memory device may be operated when a change of the address Add occurs in the case where the chip enable signal M-CE# is an "L" level as described above. With the change of the address Add, the address transition detection signal ATD is generated. In accordance with the fall of the signal ATD, a row activation signal INTZRAS, a word activation signal RXT, a sense amplifier activation signal SO, and a column activation signal ZCOLRE are activated in succession. More specifically, row activation signal INTZRAS activates a row circuit for generating a row address based on the change of the address Add of the chip enable signal M-CE#. Word activation signal RXT activates a word line following activation of the row activation signal INTZRAS. Sense amplifier activation signal SO activates a read sense amplifier following activation of the word activation signal RXT. As described above, a predetermined time is necessary until column activation signal ZCOLRE is activated after address Add changes.

On the other hand, in accordance with external write signal WE#, internal write signal INTWE is activated, and thereafter, the activated signal is input to a head one-shot 1 for generating an "L" level one-shot pulse when internal write signal INTWE rises. Then, in accordance with the rise on an output node RS_FF_OUT1 of a reset-set flip-flop circuit RS_FF1, write early set signal ZCASWSF is output from a head one-shot 2 after a predetermined time, and then, is input to shift circuit 3.

As shown in FIG. 3, shift circuit 3 outputs (activates) write set signal ZCASWS when column activation signal ZCOLRE is activated in case where the write early set signal ZCASWSF is output (activated). However, when column activation signal ZCOLRE is non-active, shift circuit 3 outputs write set signal ZCASWS after column activation signal ZCOLRE is activated.

At the point of time when write early set signal ZCASWSF is input, column activation signal ZCOLRE is already active. Therefore, shift circuit 3 outputs write set signal ZCASWS immediately when the write early set signal ZCASWSF is inputted thereto.

Internal signal CDEW is activated by the activation of write set signal ZCASWS, thereby internal write signal WDRV is activated. At this point of time, column activation signal ZCOLRE is activated; therefore, the write of data DQ is carried out. Subsequently, internal write control signal WDRV is non-activated since the chip enable signal M-CE# is an "H" level.

Figure 5:
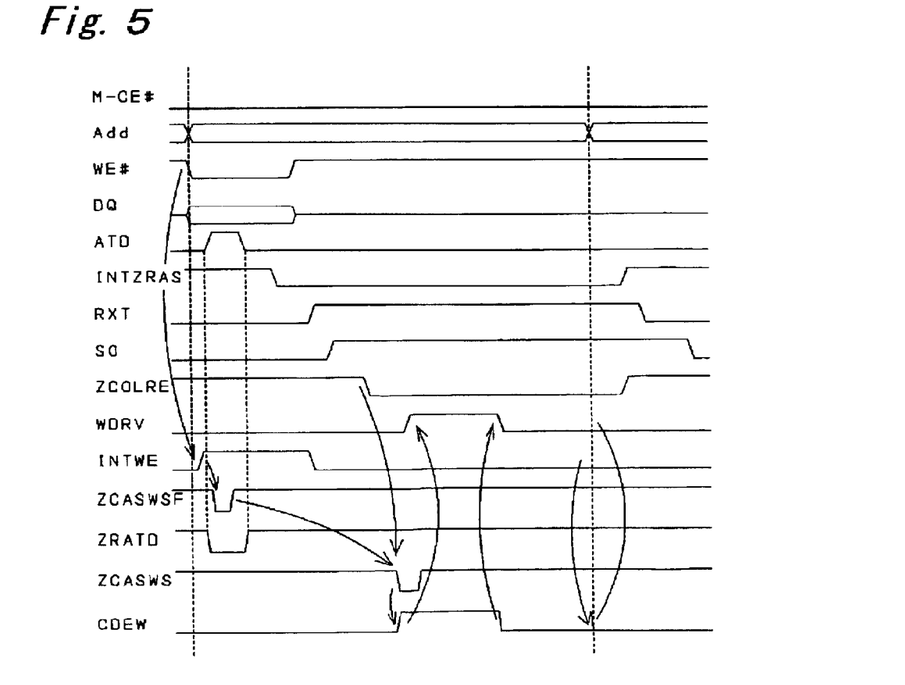
FIG. 5 is a timing diagram showing an operation of semiconductor memory device.

FIG. 5 is a timing diagram showing the case where external write signal WE# is activated in the first half cycle of the address Add. The external write signal WE# is activated at the same time with a change of the address Add, and then, data DQ is input. Next, internal write signal INTWE is activated. By activating the INTWE signal, write early set signal ZCASWSF is set as in the case described in connection with FIG. 3. However, at this point of time, column activation signal ZCOLRE is non-active. For this reason, write set signal ZCASWS is not set.

On the other hand, with the change of the address Add, address transition detection signal ATD, row activation signal INTZRAS, word activation signal RXT, sense amplifier activation signal SO, and column activation signal ZCOLRE are activated in succession.

At the point of time when column activation signal ZCOLRE is activated, write set signal ZCASWS is set. By the activation of write set signal ZCASWS, internal signal CDEW is activated, thereby internal write signal WDRV is activated. At this point time, column activation signal ZCOLRE is activated. For this reason, data is written from data input-output pin DQ.

As described above, even if write early set signal ZCASWSF is set, shift circuit 3 does not output write set signal ZCASWS immediately. Instead, it outputs the write set signal ZCASWS after the column activation signal ZCOLRE is activated for permitting a write operation to be performed.

Figure 6:
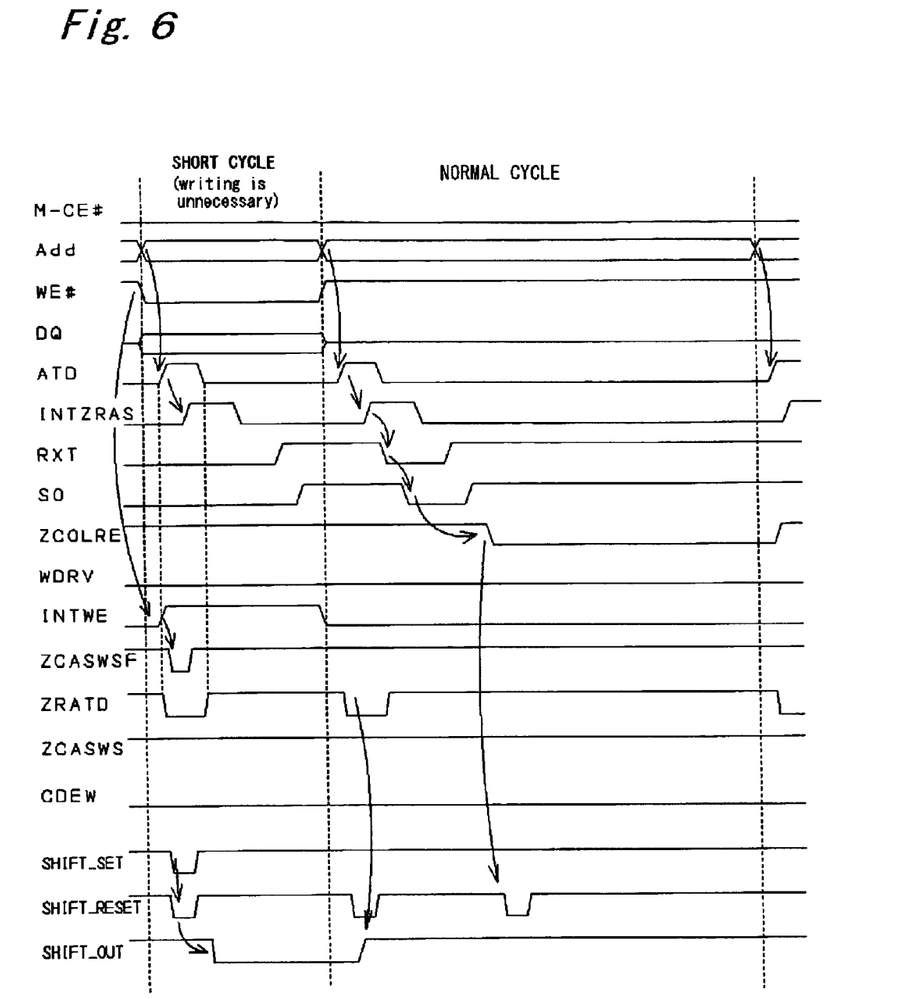
FIG. 6 is a timing diagram showing an operation of semiconductor memory device.

FIG. 6 is a timing chart showing a timing in the case where the write signal WE# is generated for the period of a short cycle in which the address signal changes in a period shorter than a predetermined period. In this case, a cycle means the period between the change of address signal and the next change thereof. Data is input from data output pin DQ at the same time with the change of the address signal. In accordance with the generation of external write signal WE#, the internal write signal INTWE is activated, and then, write early set signal ZCASWSF is set. However, at this point of time, column activation signal ZCOLRE is non-active. Therefore, no write set signal ZCASWS is output.

In accordance with the change of the next address Add, the address transition detection signals ATD and ZRATD are generated. When receiving signal ATD, shift circuit 3 generates a row activation signal INTZRAS. Row activation signal INTZRAS is reset in the next address change.

In the case where the next address Add changes at a timing earlier than a timing when column activation signal ZCOLRE is activated, with the address change, shift circuit 3 generates address transition detection signal ATD and signal ZRATD, which is a reversal signal to the ATD. By doing so, a shift reset signal SHIFT_RESET signal is generated. On the other hand, write set signal ZCASWS is not set. For this reason, internal write control signal WDRV is not activated. Therefore, data write is not carried out. As described above, shift circuit 3 of FIG. 2 functions as a non-activating unit for non-activating internal write control signal WDRV in the case where external write signal is input during the short cycle.

As is evident from the above description, according to a first aspect of the disclosed concepts, the semiconductor memory device includes a delay unit for delaying the output of the internal write control signal until the column activation signal is activated even if the write signal is generated. Therefore, at the point of time when the write signal is generated, it is possible to solve a problem that no write is carried out because the column activation signal is not activated.

According to a second aspect of the disclosed concepts, the delay unit outputs a write set signal, which is a trigger signal of the internal write control signal in the case where the internal write signal is activated and the column activation signal is activated. Further, in the case where the internal write signal is activated and the column activation signal is non-active, the delay unit outputs the write set signal after the column activation signal is activated, so that the internal write control signal can be activated according to an output of the write set signal. Therefore, it is possible to realize a semiconductor memory device by a simple logic device.

According to a third aspect of the disclosed concepts, the semiconductor memory device includes a non-activation unit for non-activating the internal write control signal by a change of the external address signal of the next cycle when the external write signal is inputted under a short cycle in which the external address signal is inputted in a period shorter than a predetermined period. Therefore, it is possible to prevent error write even if the write signal is generated under the short cycle.

According to a fourth aspect of the disclosed concepts, in the case where a change of the next address occurs at a timing earlier than a timing when the column activation signal is activated, the non-activation unit generates an address transition detection signal with the change of the external address signal, and outputs no write set signal, so that the internal write control signal is not activated. Therefore, it is possible to realize a semiconductor memory device by a simple logic device.

What is claimed is:

1. A semiconductor memory device comprising:

a memory cell array having a plurality of memory cells arranged in a matrix;

a row address circuit and a column address circuit for executing a write operation to write data inputted from an external unit on memory cell having an address corresponding to an external address signal; and a clock generating circuit including an internal write control signal generating circuit for generating a column activation signal to control the activation of said column address circuit based on an address transition detection signal generated in accordance with a change of said external address signal, and for Generating an internal write control signal to control said write operation responding to an external write signal inputted from the external unit;

wherein said internal write control signal generating circuit comprises a delay circuit for delaying the activation of the internal write control signal until said column activation signal is activated.

2. The semiconductor memory device according to claim 1, wherein said delay circuit outputs a trigger signal to activate said internal write control signal, when both said column activation signal and an input signal of said internal write control signal generating circuit which is actuated in response to said external write signal are activated.

3. The semiconductor memory device according to claim 1 wherein in the case when a next external address signal is inputted before said column activation signal is activated after the input of said external address signal previously inputted corresponding to the external write signal and then the address transition detection signal is generated in accordance with the change of said next external address signal, said internal write control signal-generating circuit holds the activated state of said internal write control signal based on said address transition detection signal corresponding to said next external address signal even if said column activation signal is activated after the generation of said address transition detection signal.

4. The semiconductor memory device according to claim 3, wherein in the case when said address transition detection signal corresponding to said next external address signal is inputted before said column activation signal is activated after said signal inputted to said internal write control signal generating circuit is activated in response to said external write signal, said delay circuit holds the non-activated state of the trigger signal, even if said column activation signal is activated.

* * * * *